US012673820B2

(12) United States Patent
Inagaki

(10) Patent No.: US 12,673,820 B2
(45) Date of Patent: Jul. 7, 2026

(54) MAGAZINE STORAGE DEVICE

(71) Applicant: FUJI CORPORATION, Chiryu (JP)

(72) Inventor: Shigeyoshi Inagaki, Yokkaichi (JP)

(73) Assignee: FUJI CORPORATION, Chiryu (JP)

( * ) Notice: Subject to any disclaimer, the term of this patent is extended or adjusted under 35 U.S.C. 154(b) by 247 days.

(21) Appl. No.: 18/291,823

(22) PCT Filed: Aug. 17, 2021

(86) PCT No.: PCT/JP2021/030036
§ 371 (c)(1),
(2) Date: Jan. 24, 2024

(87) PCT Pub. No.: WO2023/021577
PCT Pub. Date: Feb. 23, 2023

(65) Prior Publication Data
US 2024/0343487 A1 Oct. 17, 2024

(51) Int. Cl.
*B65G 1/06* (2006.01)
*H05K 13/00* (2006.01)

(52) U.S. Cl.
CPC .......... *B65G 1/06* (2013.01); *H05K 13/0084* (2013.01); *B65G 2201/0235* (2013.01)

(58) Field of Classification Search
CPC .............. B65G 1/06; B65G 2201/0235; H05K 13/0084; H05K 13/021; H05K 13/0413; H05K 13/0853
See application file for complete search history.

(56) References Cited

FOREIGN PATENT DOCUMENTS

| JP | 5-75293 A | | 3/1993 | |
| JP | H0575293 A | * | 3/1993 | |
| JP | H07125836 A | * | 5/1995 | |
| JP | 2002261492 A | * | 9/2002 | |
| WO | WO-2014010084 A1 | * | 1/2014 | .......... H05K 13/021 |

OTHER PUBLICATIONS

International Search Report Issued Oct. 12, 2021, in PCT/JP2021/030036, filed on Aug. 17, 2021, therein 2 pages.

* cited by examiner

*Primary Examiner* — Saul Rodriguez
*Assistant Examiner* — Brendan P Tighe
(74) *Attorney, Agent, or Firm* — Oblon, McClelland, Maier & Neustadt, L.L.P.

(57) ABSTRACT

A magazine storage device according to the present disclosure is for delivering a magazine capable of holding a component mounter member between the magazine storage device and a conveyance wheeled platform configured to convey the magazine, the magazine storage device including a magazine loading table configured to place the magazine thereon and a lifting and lowering mechanism configured to change a delivery height when the magazine loading table performs delivery of the magazine.

5 Claims, 12 Drawing Sheets

MAGAZINE STORAGE DEVICE

TECHNICAL FIELD

The present disclosure relates to a magazine storage device.

BACKGROUND ART

Conventionally, there is known a delivery system capable of smoothly delivering an exchange table holding a part feeder between a table moving device and a wheeled platform. For example, Patent Literature 1 discloses a delivery system including a wheeled platform having a height adjustment mechanism for detecting a height of the wheeled platform and matching the height of the wheeled platform with a height of a table moving device when an exchange table is delivered between the table moving device and the wheeled platform.

PATENT LITERATURE

Patent Literature 1: JP-A-H5-75293

BRIEF SUMMARY

Technical Problem

However, in the delivery system disclosed in Patent Literature 1, it is not possible to smoothly deliver the exchange table to a wheeled platform having no height adjustment mechanism.

The present disclosure has been made to solve the above-described problem, and a main object the present disclosure is to enable a magazine to be smoothly delivered regardless of a configuration of a delivery partner.

Solution to Problem

A magazine storage device according to the present disclosure is for delivering a magazine capable of holding a component mounter member between the magazine storage device and a conveyance wheeled platform configured to convey the magazine, the magazine storage device including a magazine loading table configured to place the magazine thereon and a lifting and lowering mechanism configured to change a delivery height when the magazine loading table performs delivery of the magazine.

The magazine storage device includes a lifting and lowering mechanism that is capable of changing a delivery height when the magazine loading table delivers the magazine. In this way, when the magazine is delivered to and from the conveyance wheeled platform, the delivery height can be changed according to the height of the conveyance wheeled platform. Accordingly, regardless of the configuration of the delivery partner, the magazine storage device can smoothly deliver the magazine by itself. The delivery of the magazine includes both reception of the magazine from the conveyance wheeled platform and delivery of the magazine to the conveyance wheeled platform.

DESCRIPTION OF EMBODIMENTS

Figure 1:
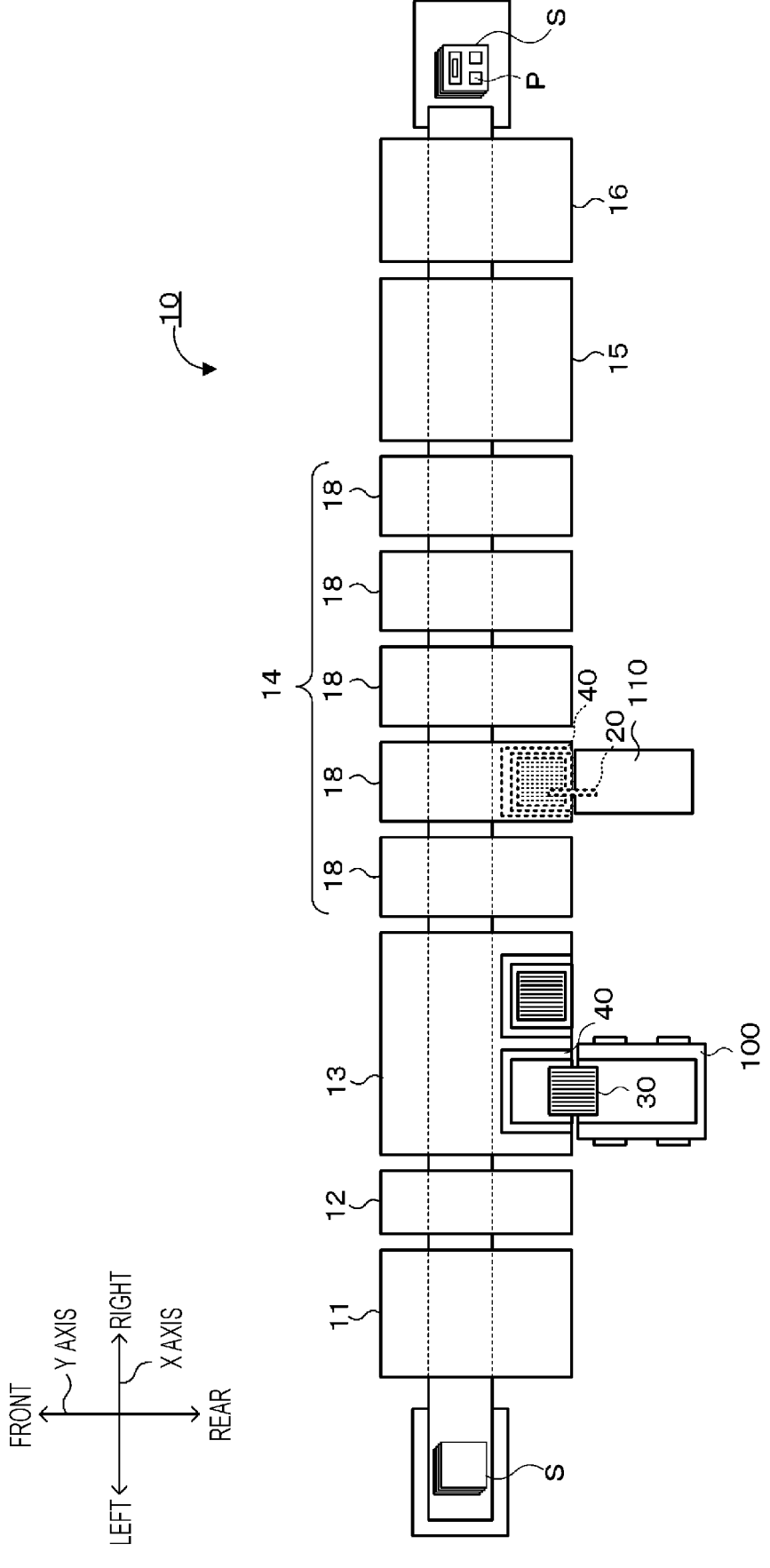
FIG. 1 is a diagram illustrating a schematic configuration of component mounting system 10.
Figure 2:
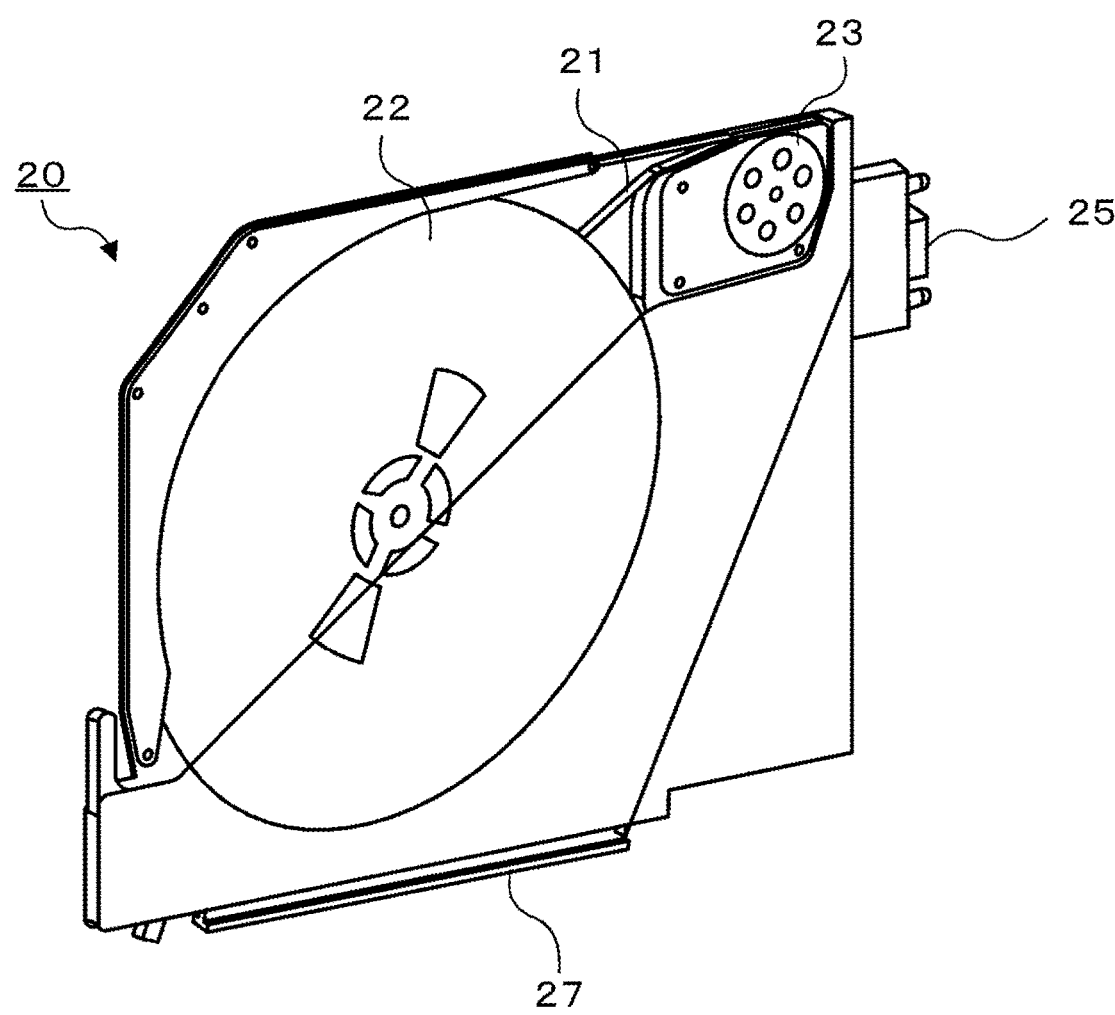
FIG. 2 is a diagram illustrating feeder 20.
Figure 3:
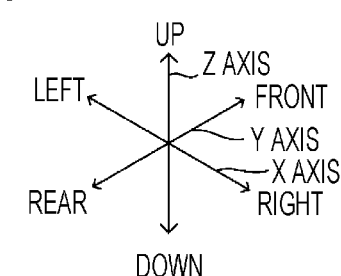
FIG. 3 is a diagram illustrating magazine 30.
Figure 3:
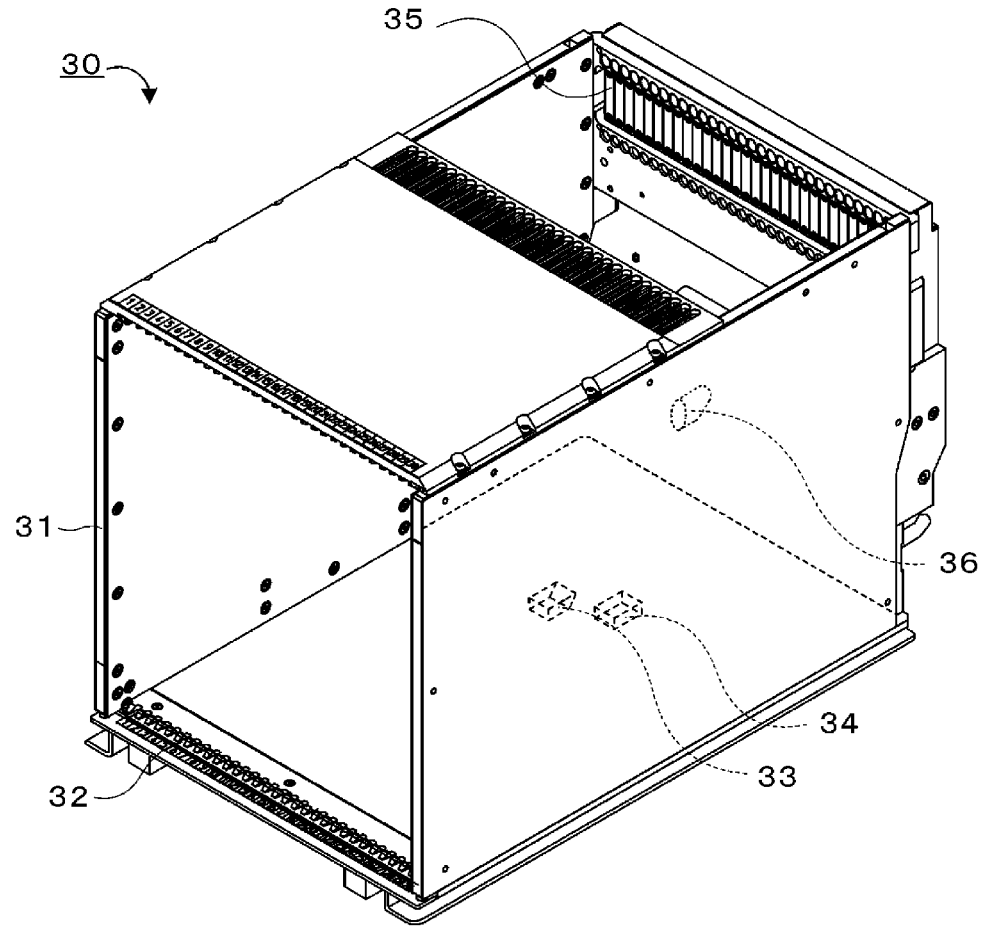
Figure 4:
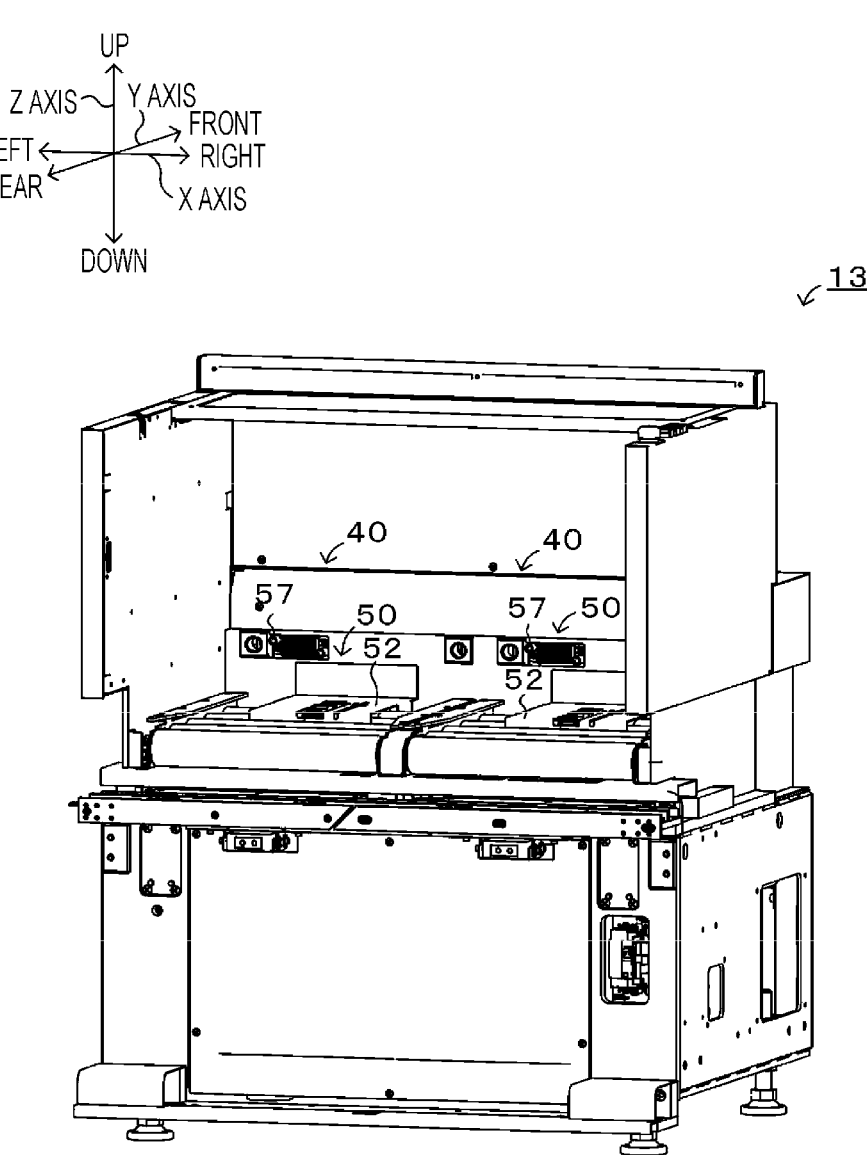
FIG. 4 is a diagram illustrating keeping device 13.
Figure 5:
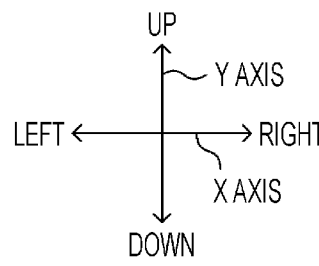
FIG. 5 is a diagram illustrating keeping device 13.
Figure 5:
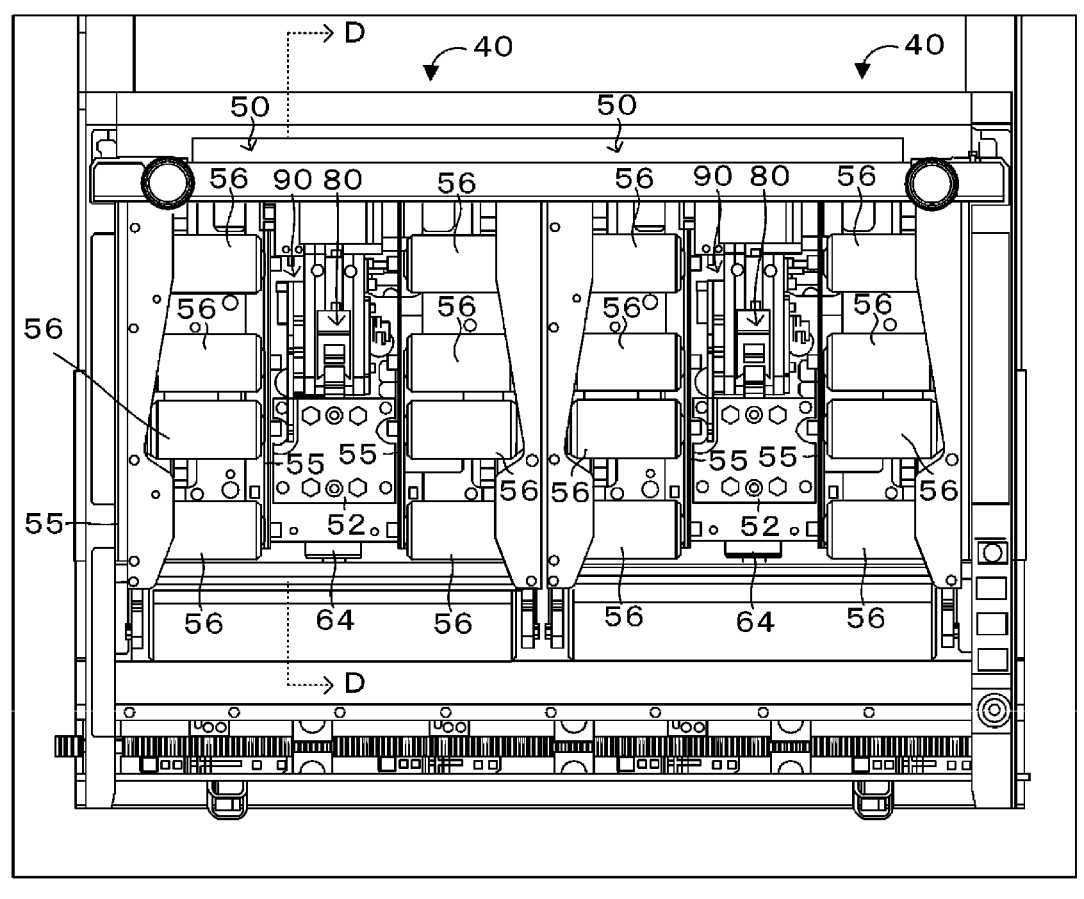
Figure 6:
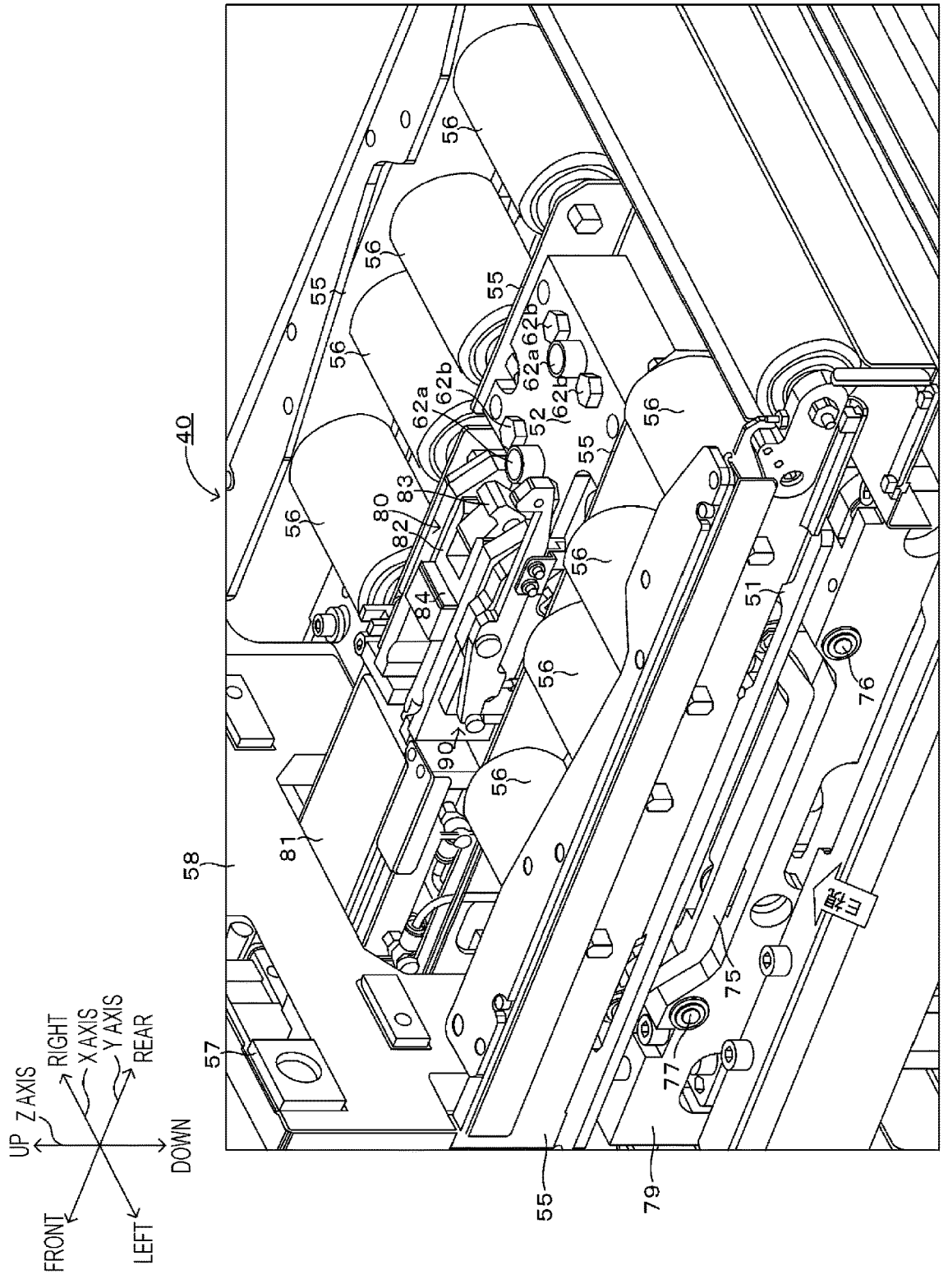
FIG. 6 is a diagram illustrating magazine storage device 40.
Figure 7:
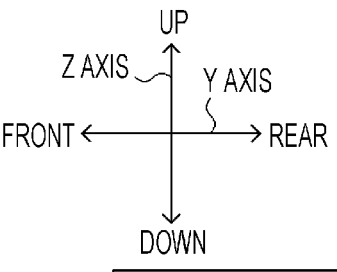
FIG. 7 is a diagram illustrating lifting and lowering mechanism 60.
Figure 7:
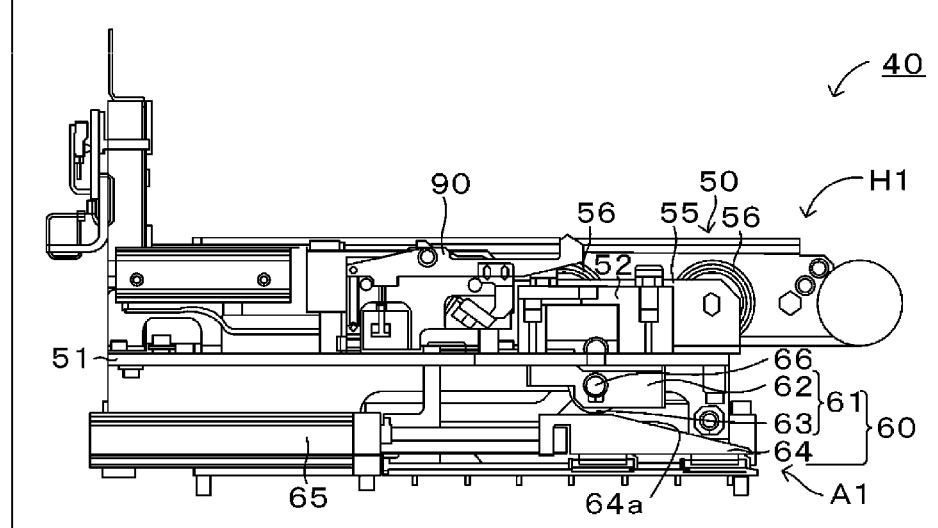
Figure 8:
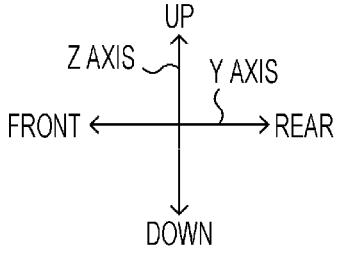
FIG. 8 is a diagram illustrating lifting and lowering mechanism 60.
Figure 8:
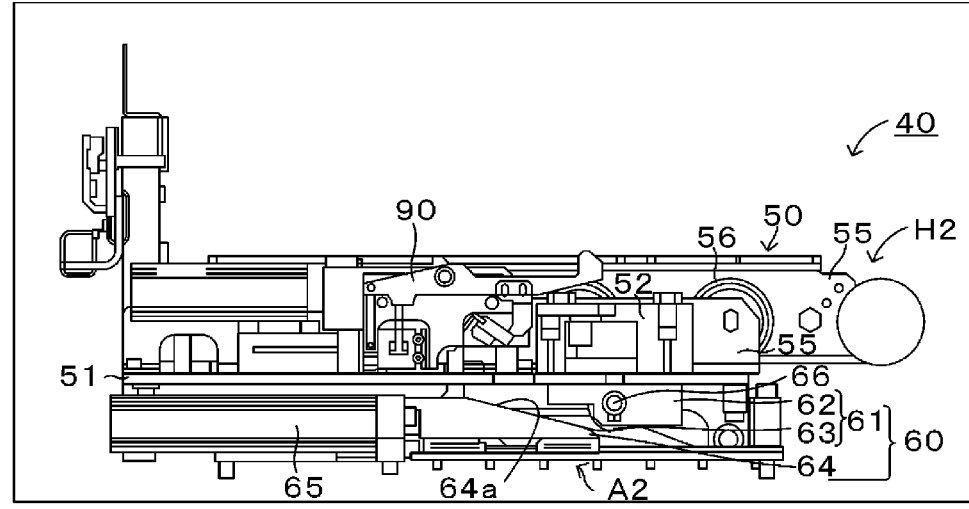
Figure 9:
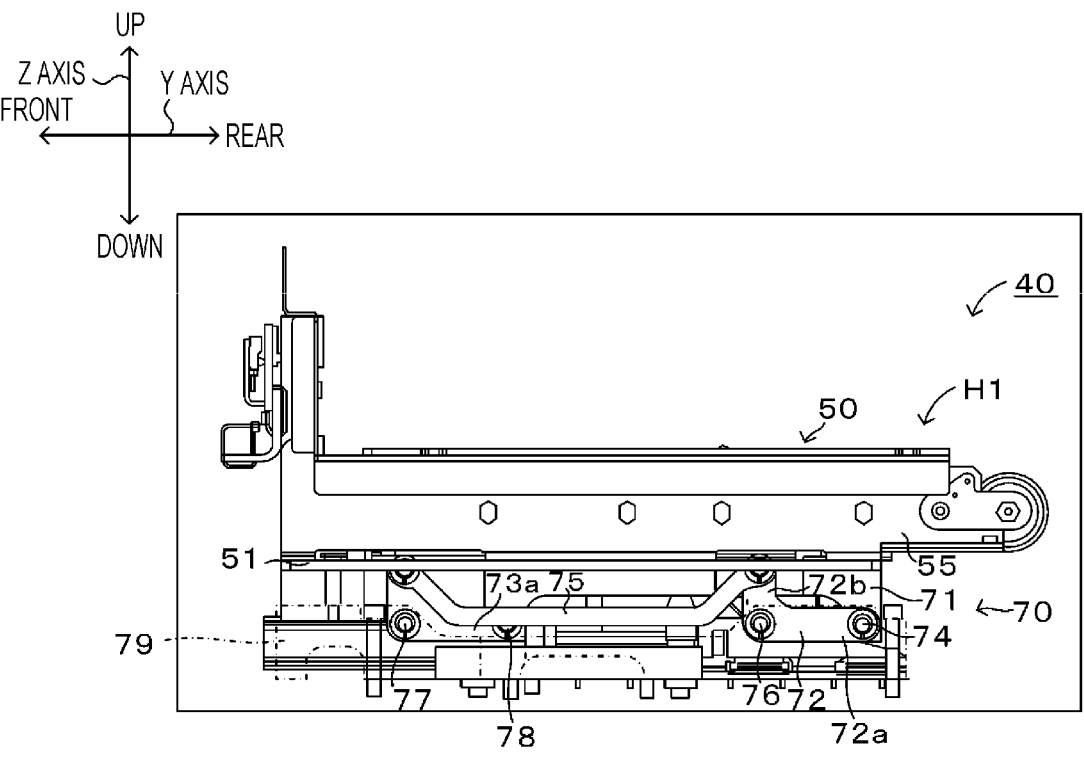
FIG. 9 is a diagram illustrating guide mechanism 70.
Figure 10:
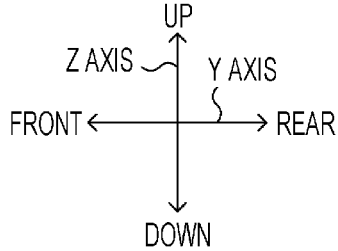
FIG. 10 is a diagram illustrating guide mechanism 70.
Figure 10:
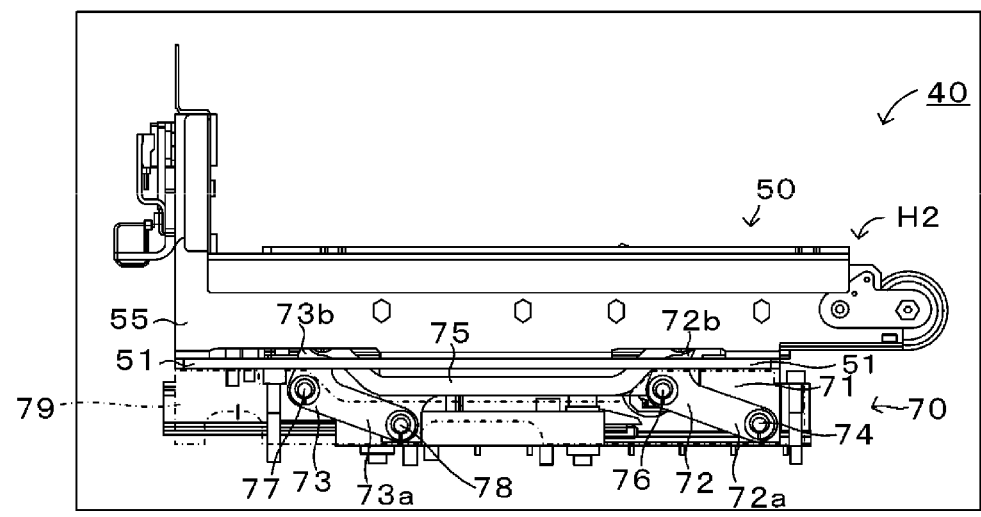
Figure 11:
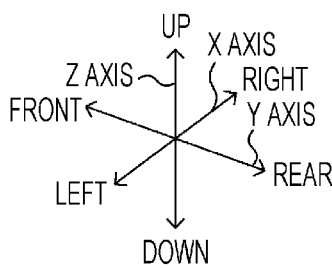
FIG. 11 is a diagram illustrating anti-back mechanism 90.
Figure 11:
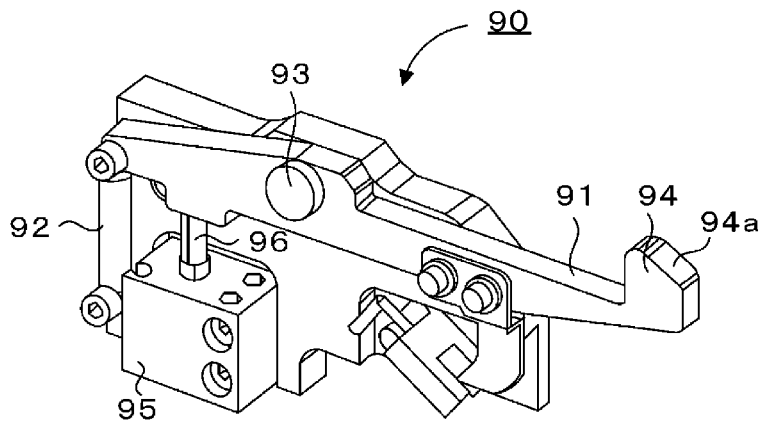
Figure 12:
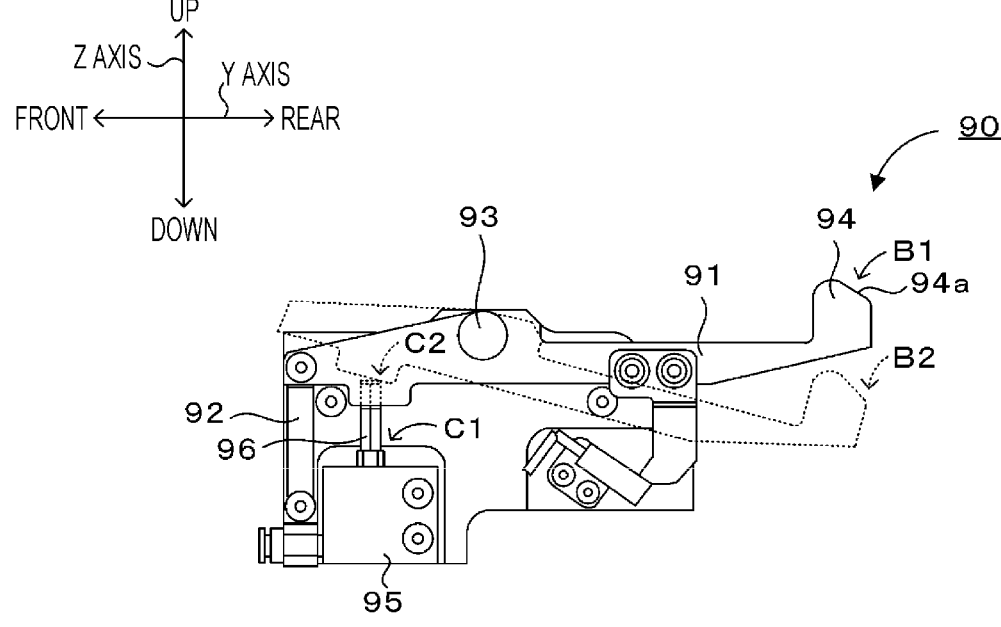
FIG. 12 is a side view of anti-back mechanism 90.
Figure 13:
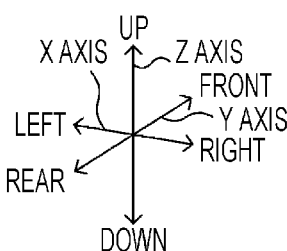
FIG. 13 is a diagram illustrating conveyance wheeled platform 100.
Figure 13:
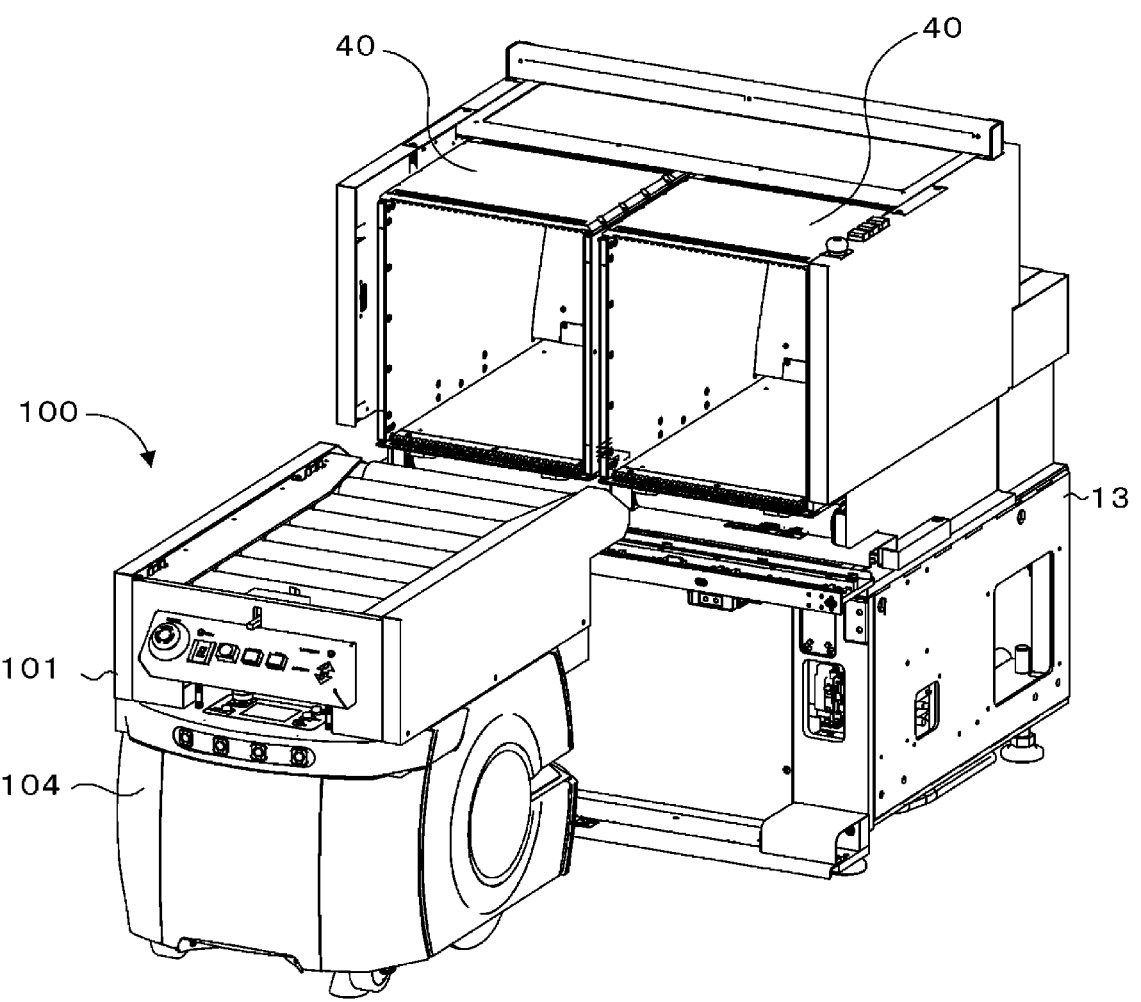
Figure 14:
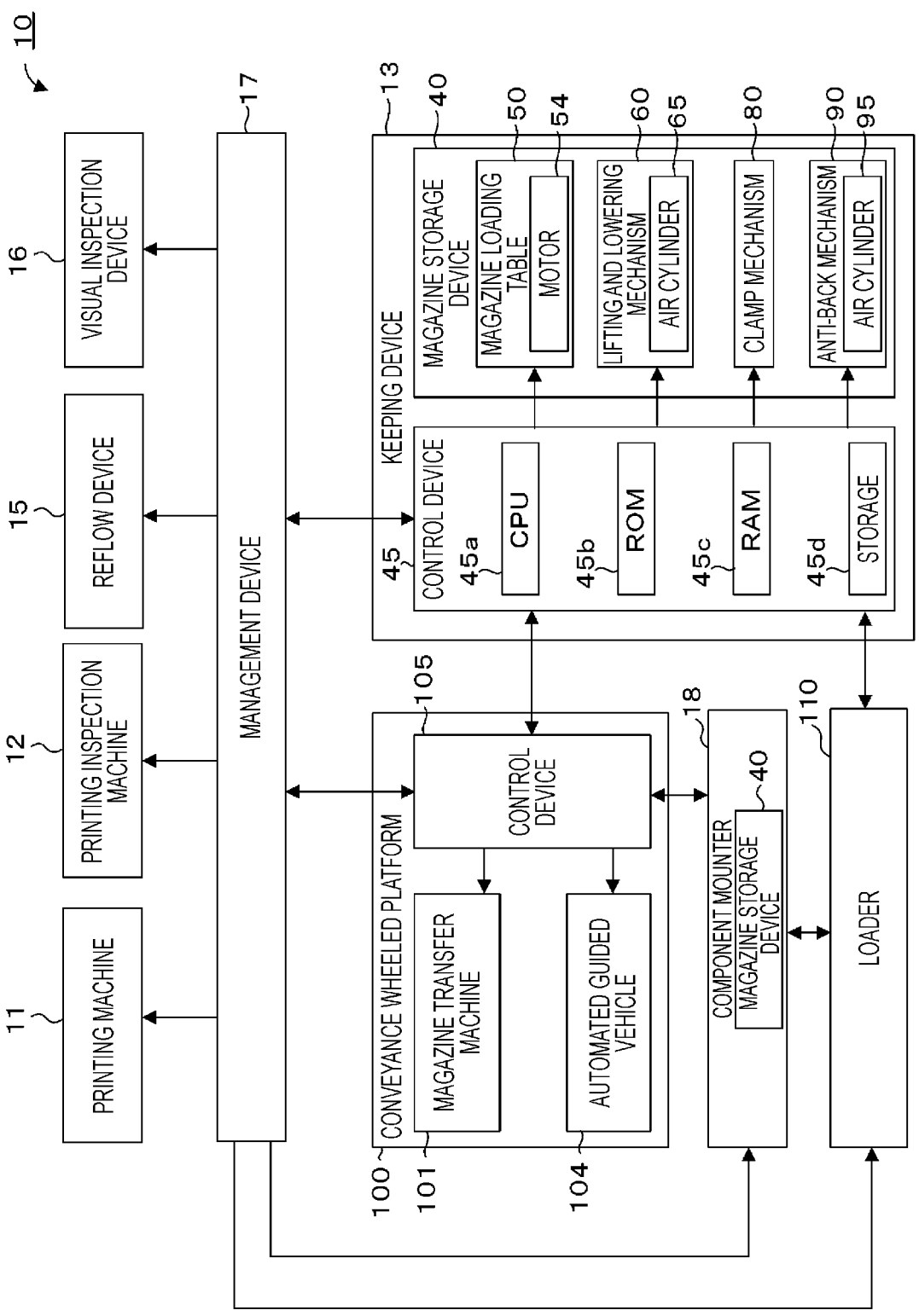
FIG. 14 is a block diagram illustrating an electric connection relationship of component mounting system 10.

Hereinafter, an embodiment of the present disclosure will be described with reference to the accompanying drawings. FIG. 1 is a diagram illustrating a schematic configuration of component mounting system 10, FIG. 2 is a diagram illustrating feeder 20, FIG. 3 is a diagram illustrating magazine 30, FIGS. 4 and 5 are diagrams illustrating keeping device 13, FIG. 6 is a diagram illustrating magazine storage device 40, FIGS. 7 and 8 are diagrams illustrating lifting and lowering mechanism 60 (FIGS. 7 and 8 are cross-sectional views taken along a line D-D in FIG. 5), FIGS. 9 and 10 are diagrams illustrating guide mechanism 70 (FIGS. 9 and 10 are E-views of FIG. 6), FIGS. 11 and 12 are diagrams illustrating anti-back mechanism 90, FIG. 13 is a diagram illustrating conveyance wheeled platform 100, and FIG. 14 is a block diagram illustrating an electric connection relationship of component mounting system 10. A left-right direction (X-axis direction), a front-rear direction (Y-axis direction), and an up-down direction (Z-axis direction) are as illustrated in each of the drawings (in FIGS. 1 and 5, the up-down direction is a direction perpendicular to the paper surface, and in FIGS. 7 to 10 and 12, the left-right direction is a direction perpendicular to the paper surface). In addition, in FIGS. 7 and 8, hatching representing a cut surface is omitted, and in FIGS. 9 and 10, fixed member 79 is represented by a one-dot chain line for convenience of description.

Component mounting system 10 includes printing machine 11, printing inspection machine 12, keeping device 13, component mounting line 14, reflow device 15, visual inspection device 16, conveyance wheeled platform 100, loader 110 (corresponding to an exchange device of the present disclosure), and management device 17 (see FIG. 14).

Printing machine 11 is a machine that prints solder on a wiring pattern of board S, and includes a board conveyance device that conveys board S, a printing head, a head moving device that moves the printing head, a fixing frame to which a screen mask is fixed, a control device that is a computer including CPU, ROM, RAM, a storage (for example, HDD or SSD), and the like.

Printing inspection machine 12 is a machine that inspects a state of the solder printed on board S by printing machine 11, and includes an inspection mechanism, a control device (computer) for controlling the inspection mechanism, and the like.

Component mounting line 14 includes multiple (five in the present embodiment) component mounters 18 disposed along a conveyance direction of board S. Component mounter 18 is a device that mounts component P on board S on which the solder is printed by printing machine 11. Component mounter 18 includes magazine storage device 40. Magazine storage device 40 is connected to component mounter 18. Magazine storage device 40 will be described later as being installed in keeping device 13, but is also installed in component mounter 18.

Reflow device 15 is disposed downstream of component mounting line 14. Reflow device 15 heats board S to melt the solder, then cools board S to electrically connect component P to board S, and fixes component P to board S.

Visual inspection device 16 is disposed downstream of reflow device 15. Visual inspection device 16 determines whether an amount of positional deviation between an actual mounting position and a predetermined target mounting position falls within a visual inspection allowable range for each of components P on board S.

Before describing keeping device 13, feeder 20 (corresponding to a component mounter member and a component supply member of the present disclosure) and magazine 30 will be described. As illustrated in FIG. 2, feeder 20 is a cassette type tape feeder including tape reel 22 around which tape 21 accommodating multiple components P is wound, tape feeding mechanism 23, connector 25, rail 27, and feeder control device that controls tape feeding mechanism 23 (not illustrated), and the like.

Magazine 30 is an accommodation case that is capable of accommodating multiple feeders 20. As illustrated in FIG. 3, magazine 30 includes magazine main body 31, slot 32, engaged portion 33, clamped portion 34, connector 35 for a feeder, and connector 36 for a magazine storage device. Magazine main body 31 is a rectangular parallelepiped housing. Multiple slots 32 are provided along the left-right direction on a bottom surface on a rear entrance side of magazine main body 31. Slot 32 can hold feeder 20 by inserting rail 27 of feeder 20 into slot 32 from the rear direction. Engaged portion 33 is a projection provided on a front side of a back side of the bottom surface of magazine main body 31, and can be engaged with hook 94 of anti-back mechanism 90 described later. Clamped portion 34 is a projection provided on a front side of the back side of the bottom surface of magazine main body 31, and is clamped by clamp mechanism 80 of magazine storage device 40 described later. Connector 35 is connected to connector 25 of feeder 20 when feeder 20 is inserted into slot 32. Connector 36 can be connected to connector 57 of magazine loading table 50 described later.

As illustrated in FIG. 1, keeping device 13 is provided between printing inspection machine 12 and component mounting line 14. Keeping device 13 is a device that keeps magazine 30. As illustrated in FIGS. 4 and 5, keeping device 13 includes magazine storage devices 40 arranged side by side in the left-right direction and control device 45 (see FIG. 14).

As illustrated in FIGS. 4 to 10, magazine storage device 40 includes magazine loading table 50, lifting and lowering mechanism 60, guide mechanism 70, clamp mechanism 80, and anti-back mechanism 90.

Magazine loading table 50 is a table on which magazine 30 is placed. Magazine loading table 50 includes plate 51, magazine loading table main body 52, roller 56, and connector 57.

As illustrated in FIGS. 7 to 10, plate 51 is a plate-shaped member to which various members are attached.

As illustrated in FIGS. 6 to 8, magazine loading table main body 52 is a rectangular parallelepiped member provided substantially at the center of an upper surface of plate 51. An internal space (not illustrated) communicating with a vertical hole penetrating plate 51 in the up-down direction is formed in the main body of magazine loading table 52.

Multiple rollers 56 are provided on each of the left and right sides of magazine loading table main body 52 along the front-rear direction. Roller 56 is rotatably attached to roller attachment member 55 attached to the upper surface of plate 51. After magazine 30 is placed on roller 56, roller 56 receives the power of motor 54 (see FIG. 14) and rotates forward or rearward to move forward or rearward in magazine storage device 40.

As illustrated in FIG. 6, connector 57 is provided on wall section 58 provided on a front side of the upper surface of plate 51. Connector 57 can be connected to connector 36 (see FIG. 3) provided on a front surface of magazine 30. In a case where connector 57 and connector 36 are connected, control device 45 (see FIG. 14) of keeping device 13 and magazine 30 can communicate with each other, and control device 45 acquires information relating to magazine 30 (information relating to component P held by feeder 20 set in slot 32, information relating to whether feeder 20 is set in slot 32, or the like).

As illustrated in FIGS. 7 and 8, lifting and lowering mechanism 60 includes following member 61 and wedge member 64. Lifting and lowering mechanism 60 is a mechanism that moves magazine loading table 50 up and down between delivery height H1 (see FIG. 7) at which magazine 30 is delivered to and from conveyance wheeled platform 100 described later and work height H2 (see FIG. 8) at which work is performed on feeder 20. Work height H2 is, for example, a height when loader 110 described later replenishes and collects feeder 20 to and from magazine 30 stored in magazine storage device 40.

Following member 61 is attached to magazine loading table main body 52. Following member 61 is a member in which guide roller 63 is rotatably attached to guide roller support 62 by shaft 66. Guide roller support 62 is inserted into the internal space of magazine loading table main body 52 integrated with plate 51 so as to be movable up and down. Guide roller support 62 is positioned in the up-down direction with respect to magazine loading table main body 52 by set screw 62a (see FIG. 6) and is screwed to magazine loading table main body 52 by screw 62b (see FIG. 6). A predetermined portion including a lower surface of set screw 62a is exposed to the internal space of magazine loading table main body 52. A height of the lower surface of set screw 62a changes depending on the screwing amount of set screw 62a. Screw 62b passes through a hole (not illustrated) that passes through magazine loading table main body 52 in the up-down direction with clearance around the hole, and is screwed into a screw hole (not illustrated) provided in guide roller support 62. An upper surface of guide roller support 62 approaches the bottom surface of magazine loading table main body 52 by tightening screw 62b, and is separated from the bottom surface of magazine loading table main body 52 by loosening screw 62b. Screw 62b is tightened so that the upper surface of guide roller support 62 contacts the lower surface of set screw 62a. Therefore, by adjusting the screwing amount of set screw 62a and tightening screw 62b so that the upper surface of magazine loading table main body 52 comes into contact with the lower surface of set screw 62a, a position of guide roller support 62 in the up-down direction with respect to magazine loading table main body 52 can be adjusted. That is, a height of following member 61 can be adjusted by set screw 62a and screw 62b. In addition, delivery height H1 of magazine loading table 50 illustrated in FIG. 7 can be changed by adjusting the height of following member 61 with respect to magazine loading table main body 52. Specifically, delivery height H1 increases as the position of guide roller support 62 with respect to the bottom surface of magazine loading table main body 52 is lower.

Wedge member 64 is provided below following member 61. Wedge member 64 is movable in the horizontal direction (front-rear direction) by receiving power of air cylinder 65. In a case where wedge member 64 moves from the front side to the rear side in a state where inclined surface 64a comes into contact with guide roller 63 of following member 61, wedge member 64 pushes up following member 61 and magazine loading table main body 52. Accordingly, wedge member 64 moves magazine loading table 50 upward. Until wedge member 64 moves to rear position A1 illustrated in FIG. 7 after guide roller 63 passes over inclined surface 64a, guide roller 63 comes into contact with the horizontal plane of the upper surface of wedge member 64, and magazine loading table 50 is positioned at delivery height H1. On the other hand, in a case where wedge member 64 moves from the rear side to the front side in a state where wedge member 64 comes into contact with guide roller 63 of following member 61, magazine loading table 50 moves downward along inclined surface 64a by its own weight. Then, until wedge member 64 moves to front position A2 illustrated in FIG. 8 after magazine loading table 50 reaches work height H2, inclined surface 64a moves forward away from guide roller 63, and magazine loading table 50 is positioned at work height H2. When magazine loading table 50 is positioned at work height H2, magazine loading table 50 is placed on magazine loading table support fixed to a frame (not illustrated) of magazine storage device 40. Work height H2 is the lowest position in a movable range of magazine loading table 50.

As illustrated in FIGS. 9 and 10, guide mechanism 70 is provided on the lower side of plate 51. Guide mechanism 70 is a mechanism that guides magazine loading table 50 so that magazine loading table 50 is lifted and lowered in a horizontal state. Guide mechanism 70 includes movable member 71, fixed member 79, first link member 72, second link member 73, and connection member 75.

Movable members 71 are provided one each on the left side and the right side of the lower surface of plate 51, and move up and down according to the up and down movement of plate 51. Movable member 71 is a plate-shaped member extending in the front-rear direction.

Fixed members 79 are provided one each on the outer side in the left-right direction of each movable member 71, and are fixed at constant positions regardless of the up and down movement of plate 51. Fixed member 79 is a plate-shaped member extending in the front-rear direction.

First link member 72 is attached to the rear side of fixed member 79 via shaft 76. First link member 72 is an L-shaped member, and is swingable in the up-down direction about shaft 76 provided at an L-shaped corner. First link member 72 includes rear side portion 72a and front side portion 72b. Rear side portion 72a is attached to the rear side of movable member 71 via needle bearing 74.

Second link member 73 is attached to the front side of fixed member 79 via shaft 77. Second link member 73 is an L-shaped member, and is swingable in the up-down direction about shaft 77 provided at an L-shaped corner. Second link member 73 includes rear side portion 73a and front side portion 73b. Rear side portion 73a is attached to the front side of movable member 71 via needle bearing 78.

Connection member 75 is a member that connects front side portion 72b of first link member 72 and front side portion 73b of second link member 73. Rear side portions 72a and 73a of first and second link members 72 and 73 swing in the up-down direction about shafts 76 and 77, respectively, as plate 51 integrated with movable member 71 moves in the up-down direction. At this time, since front side portions 72b and 73b of first and second link members 72 and 73 are connected by connection member 75, the movements of first and second link members 72 and 73 are interlocked. Therefore, when magazine loading table 50 is lifted and lowered, it is possible to prevent magazine loading table 50 from inclining or rattling. Front side portion 72b and front side portion 73b are attached to connection member 75 via needle bearings, respectively.

As illustrated in FIGS. 5 and 6, clamp mechanism 80 is provided in front of magazine loading table main body 52 on the upper surface of plate 51. Clamp mechanism 80 is mounted on clamp slider 82 movable in the front-rear direction by air cylinder 81. Clamp mechanism 80 has hook-shaped clamp 83. Clamp 83 is positioned by an actuator (not illustrated) between a clamp release position illustrated in FIG. 6 and a clamp position (position rotated upward from the clamp release position) (not illustrated). Clamp slider 82 stops at the position (rear position) illustrated in FIG. 6 when magazine 30 is delivered. Clamp slider 82 includes stopper 84 for stopping magazine 30 that has moved magazine loading table 50 forward.

As illustrated in FIGS. 5 and 6, anti-back mechanism 90 is provided on the left side of clamp mechanism 80 on the upper surface of plate 51. Anti-back mechanism 90 is a mechanism that prevents magazine 30 placed on magazine loading table 50 from moving in a direction (rear direction) of coming out of magazine loading table 50. As illustrated in FIGS. 11 and 12, anti-back mechanism 90 includes main body 91, spring 92, pin 96, and air cylinder 95.

As illustrated in FIG. 12, main body 91 is a rod-shaped member provided to be rotatable in the up-down direction about shaft 93. Hook 94 is formed at a rear end part of main body 91. Hook 94 is movable between engagement position B1 where hook 94 is engageable with engaged portion 33 of magazine 30 and non-engagement position B2 where hook 94 is not engageable with engaged portion 33 of magazine 30. Spring 92 is attached to a front end part of main body 91. Spring 92 biases a front end part of main body 91 downward by an elastic force.

Air cylinder 95 is provided on a front lower side of main body 91. Air cylinder 95 is power for moving pin 96 in the up-down direction between lower position C1 and upper position C2. In a case where pin 96 is positioned at lower position C1, the rear end part of main body 91 biased downward by spring 92 is positioned in a state of being in contact with an upper end of pin 96. At this time, hook 94 is positioned at engagement position B1. On the other hand, in a case where pin 96 is positioned at upper position C2, an upper surface of pin 96 pushes down the rear end part of main body 91 against the biasing of spring 92. At this time, hook 94 is positioned at non-engagement position B2. Hook 94 has guide surface 94a inclined downward from the front side to the rear side.

Control device 45 is a computer including CPU 45a, ROM 45b, RAM 45c, storage 45d, and the like as illustrated in FIG. 14. Control device 45 outputs a control signal to magazine loading table 50, outputs a control signal to lifting and lowering mechanism 60, outputs a control signal to clamp mechanism 80, and outputs a control signal to anti-back mechanism 90. In addition, control device 45 exchanges signals with management device 17 and conveyance wheeled platform 100. In addition, control device 45 outputs a replenishment signal of feeder 20 to loader 110 and outputs a collection signal of feeder 20 to loader 110.

As illustrated in FIG. 13, conveyance wheeled platform 100 is a wheeled platform that delivers magazine 30 to and from magazine storage device 40. Conveyance wheeled platform 100 includes automated guided vehicle 104 on which magazine transfer machine 101 capable of delivering magazine 30 to and from magazine storage device 40 is mounted on the upper surface, and control device 105 (see FIG. 14). Automated guided vehicle 104 is configured as, for example, an automatic guided vehicle (AGV) or an autonomous mobile robot (AMR). Control device 105 is a computer including CPU, ROM, RAM, a storage, and the like.

As illustrated in FIG. 1, loader 110 is an exchange device that replenishes and collects feeders 20 to and from magazine 30 stored in magazine storage device 40 provided in component mounter 18 or keeping device 13. In a case where magazine loading table 50 of magazine storage device 40 is positioned at work height H2, loader 110 replenishes and collects feeders 20 to and from magazine 30 stored in magazine storage device 40.

Management device 17 is a device that manages entire component mounting system 10, includes CPU, ROM, RAM, a storage, and the like, and is a computer to which an input device, such as a keyboard or a mouse, or a display is connected. The storage of management device 17 stores a production program of board S, production information related to production of board S, and the like. Here, the production program defines a mounting order of components P for board S in multiple component mounters 18 in component mounting system 10, a production number of boards S, and the like. Management device 17 outputs a control signal to printing machine 11, outputs a control signal to printing inspection machine 12, outputs a control signal to component mounter 18, outputs a control signal to reflow device 15, or outputs a control signal to visual inspection device 16.

Next, an operation of component mounting system 10 will be described. Here, an operation in which conveyance wheeled platform 100 transfers magazine 30 to magazine transfer machine 101 in a warehouse (not illustrated) and then moves from the warehouse to the front of keeping device 13 of component mounting system 10 to transfer magazine 30 to magazine storage device 40 of keeping device 13 will be described. The warehouse is located at a place different from the place at which component mounting system 10 is installed.

First, magazine 30 is transferred to magazine transfer machine 101 in the warehouse. Next, conveyance wheeled platform 100 moves to the front of keeping device 13.

Figure 15:
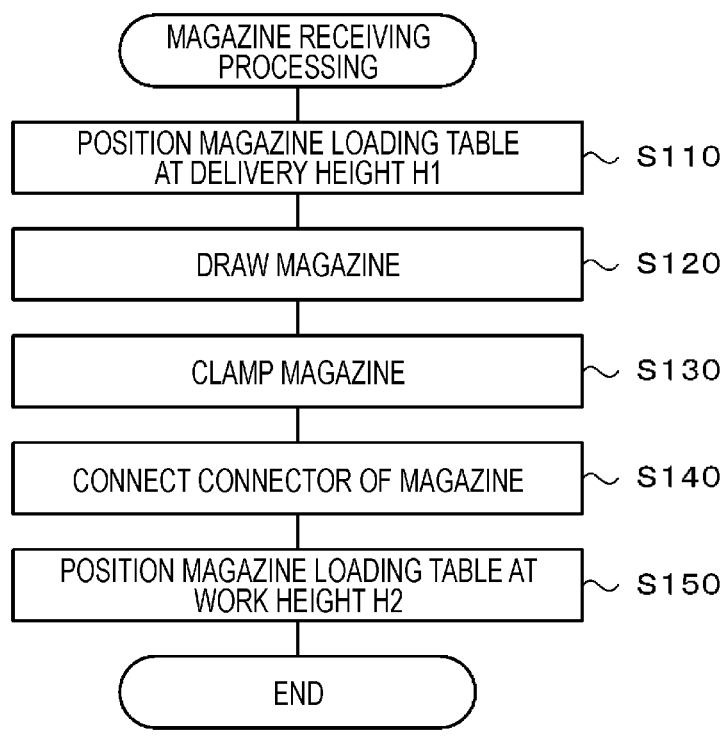
FIG. 15 is a flowchart of magazine receiving processing.

Keeping device 13 performs magazine receiving processing illustrated in FIG. 15 after conveyance wheeled platform 100 moves to the front of keeping device 13. The routine of the magazine receiving processing is stored in storage 45d, and is started after a signal indicating that conveyance wheeled platform 100 has moved to the front of keeping device 13 is input from a sensor (not illustrated). Before executing the routine, it is assumed that pin 96 of anti-back mechanism 90 is positioned at lower position C1 and hook 94 of anti-back mechanism 90 is positioned at engagement position B1. In addition, clamp slider 82 is positioned at the rear position illustrated in FIG. 6, and clamp 83 is positioned at the clamp release position illustrated in FIG. 6. In addition, in guide roller support 62 of following member 61, the screwing amount of set screw 62a is adjusted so that delivery height H1 of magazine loading table 50 matches the height of magazine transfer machine 101 of conveyance wheeled platform 100, and guide roller support 62 is screwed to magazine loading table main body 52 by screw 62b.

In a case where the magazine receiving processing is started, CPU 45a of control device 45 positions magazine loading table 50 at delivery height H1 (S110). Specifically, air cylinder 65 is controlled so that wedge member 64 moves to rear position A1. Next, CPU 45a outputs a magazine delivery signal to conveyance wheeled platform 100. In a case where the magazine delivery signal is input, control device 105 of conveyance wheeled platform 100 causes magazine transfer machine 101 to deliver magazine 30 to magazine storage device 40 side (front side).

Next, CPU 45a draws magazine 30 into magazine loading table 50 (S120). Specifically, CPU 45a causes motor 54 that drives roller 56 to draw magazine 30 into magazine loading table 50. In a case where magazine 30 moves magazine loading table 50 forward, guide surface 94a of hook 94 of anti-back mechanism 90 is pushed down by engaged portion 33 (see FIG. 3) provided on the lower surface of magazine 30 in the middle of the movement, and in a case where magazine 30 further moves forward, hook 94 and engaged portion 33 are engaged with each other. Therefore, magazine 30 is prevented by anti-back mechanism 90 from moving rearward from the position. At the same time or after that, the front end of clamped portion 34 (see FIG. 3) provided on the lower surface of magazine 30 comes into contact with stopper 84 and stops at that position.

Next, CPU 45a clamps magazine 30 (S130). Specifically, CPU 45a controls the actuator of clamp mechanism 80 so that clamp 83 is positioned from the release position to the clamp position. Thus, clamped portion 34 (see FIG. 3) of magazine 30 is clamped by stopper 84 and clamp 83. Next, CPU 45a connects connector 36 of magazine 30 and connector 57 of magazine loading table 50 (S140). Specifically, CPU 45a causes air cylinder 81 to move clamp slider 82 clamping magazine 30 forward, and connects connector 36 (see FIG. 3) of magazine 30 to connector 57 of magazine loading table 50. Next, CPU 45a positions magazine loading table 50 at work height H2 (S150). Specifically, CPU 45a controls air cylinder 65 so that wedge member 64 at rear position A1 moves to front position A2. Thereafter, CPU 45a ends the routine.

On the other hand, when magazine 30 is delivered from magazine loading table 50 to conveyance wheeled platform 100, CPU 45a executes magazine delivery processing. In the magazine delivery processing, CPU 45a first positions magazine loading table 50 from work height H2 to delivery height H1, then moves clamp slider 82 rearward to detach connector 36 of magazine 30 from connector 57 of magazine loading table 50, then releases the clamp of magazine 30 by clamp mechanism 80 and releases the lock of magazine 30 by anti-back mechanism 90, and finally drives roller 56 to send magazine 30 to conveyance wheeled platform 100.

Magazine storage device 40 described above in detail includes lifting and lowering mechanism 60 capable of changing delivery height H1 when magazine loading table 50 delivers magazine 30. Therefore, when magazine 30 is delivered to and from conveyance wheeled platform 100, delivery height H1 can be changed according to the height of conveyance wheeled platform 100. Accordingly, regardless of the configuration of conveyance wheeled platform 100, magazine storage device 40 can smoothly deliver magazine 30 by itself.

In addition, since magazine storage device 40 includes anti-back mechanism 90, it is possible to prevent magazine 30 placed on magazine loading table 50 from moving in a direction (rear direction) of coming out of magazine loading table 50. In particular, when magazine loading table 50 is lifted and lowered, magazine 30 placed on magazine loading table 50 may move in the front-rear direction, but since anti-back mechanism 90 is provided, magazine loading table 50 can be lifted and lowered safely. In addition, since magazine storage device 40 includes anti-back mechanism 90, when receiving magazine 30 from conveyance wheeled platform 100, magazine 30 can be prevented from colliding with stopper 84 and bouncing back to conveyance wheeled platform 100 side.

Further, magazine storage device 40 includes guide mechanism 70 that guides magazine loading table 50 so that magazine loading table 50 is lifted and lowered in a horizontal state. Therefore, when magazine loading table 50 is lifted and lowered, it is possible to prevent magazine loading table 50 from inclining or rattling.

In magazine storage device 40, lifting and lowering mechanism 60 includes following member 61 which is provided on magazine loading table 50 and is capable of adjusting the height, and wedge member 64 that moves magazine loading table 50 up and down by moving it in the horizontal direction while being in contact with following member 61. Therefore, by adjusting the height of following member 61, it is possible to adjust the amount of the up and down movement of magazine loading table 50 as wedge member 64 moves in the horizontal direction. Accordingly, delivery height H1 can be adjusted relatively easily.

In magazine storage device 40, lifting and lowering mechanism 60 is a mechanism that moves magazine loading table 50 between delivery height H1 and work height H2 when the work is performed on feeder 20, feeder 20 is a component supply member that supplies component P mounted on board S, and work height H2 is a height when loader 110 that is capable of replenishing and collecting feeder 20 replenishes and collects feeder 20. Therefore, loader 110 can replenish and collect feeders 20 to and from magazine 30 stored in magazine storage device 40.

The present disclosure is not limited in any way to the embodiments described above, and it is needless to say that the present disclosure can be achieved in various forms without departing from the technical scope of the present disclosure.

For example, in the above-described embodiment, work height H2 is set to a height when loader 110 replenishes and collects feeders 20 to and from magazine 30 stored in magazine storage device 40, but is not limited to this. In the embodiment described above, in a case where magazine 30 is delivered between magazine storage device 40 which is provided in component mounter 18 and conveyance wheeled platform 100, work height H2 of magazine storage device 40 may be, for example, a height at which a pickup section, which is not illustrated, of component mounter 18 (for example, a pickup section provided in a head movable in the XY directions) can pick up component P supplied by feeder 20. In this way, the pickup section of component mounter 18 can pick up component P from feeder 20 held on magazine loading table 50 at work height H2. The pickup section may be a nozzle that picks up the component using a negative pressure, or may be a mechanical chuck that mechanically grips the component.

In the above-described embodiment, a height of magazine loading table 50 when wedge member 64 is positioned at rear position A1 is set as delivery height H1, and a height of magazine loading table 50 when wedge member 64 is positioned at front position A2 is set as work height H2, but the present disclosure is not limited to this. For example, a height of magazine loading table 50 when wedge member 64 is positioned at rear position A1 may be set as work height H2, and a height of magazine loading table 50 when wedge member 64 is positioned at front position A2 may be set as delivery height H1.

In the above-described embodiment, wedge member 64 is moved in the horizontal direction via air cylinder 65, but the present disclosure is not limited to this. In the above-described embodiment, wedge member 64 may be moved in the horizontal direction using a hydraulic cylinder, a ball screw, a trapezoidal cam, or an eccentric cam. In addition, as lifting and lowering mechanism 60, an air cylinder or a hydraulic cylinder in which a rod moves up and down may be adopted, and magazine loading table 50 may be attached to the rod. Alternatively, as lifting and lowering mechanism 60, a ball screw including a screw shaft extending in the up-down direction and a nut rotatably attached to the screw shaft may be adopted, and magazine loading table 50 may be attached to the nut so that magazine loading table 50 is moved up and down with the rotation of the screw shaft.

In the above-described embodiment, as guide mechanism 70, first and second link members 72 and 73 are provided on the left and right sides of the lower surface of plate 51, but the present disclosure is not limited to this. For example, the up and down movement may be guided by using linear shafts provided at four corners of the lower surface of plate 51 and bushes that support the linear shafts.

In the above-described embodiment, feeder 20 is exemplified as the component mounter member, but the present disclosure is not limited to this. For example, as the component mounter member, a nozzle changer or the like may be used.

In the above-described embodiment, magazine 30 is locked by anti-back mechanism 90 at delivery height H1, and is clamped by clamp mechanism 80, and magazine loading table 50 is lowered to work height H2 after connector 36 and connector 57 are connected, but the present disclosure is not limited to this. For example, after magazine 30 is locked by anti-back mechanism 90 at delivery height H1, magazine loading table 50 may be lowered to work height H2, and then magazine 30 may be clamped by clamp mechanism 80 to connect connector 36 and connector 57. Even in this case, when magazine loading table 50 is lifted and lowered, magazine 30 is locked by anti-back mechanism 90, so that magazine 30 is prevented from moving rearward.

In the above-described exemplary embodiment, in a case where magazine storage device 40 performs delivery of multiple conveyance wheeled platforms 100 having different delivery heights H1 and magazines 30, delivery height H1 may be changed for each conveyance wheeled platform 100. In such a case, delivery height H1 can be changed relatively easily by adopting an air cylinder or a hydraulic cylinder in which the rod moves up and down or adopting a ball screw with a screw shaft extending in the up-down direction as a lifting and lowering mechanism. In this case, control device 45 may acquire identification information for identifying the type of conveyance wheeled platform 100 or the individual conveyance wheeled platform 100 and causes the lifting and lowering mechanism based on the acquired identification information to change delivery height H1.

The transport wheeled platform of the present disclosure may be configured as follows.

In the magazine storage device according to the present disclosure, the magazine loading table may have an anti-back mechanism configured to prevent the magazine placed on the magazine loading table from moving in a direction of coming out of the magazine loading table. In this way, it is possible to prevent the magazine placed on the magazine loading table from moving in the direction of coming out of the magazine loading table due to some cause.

The magazine storage device according to the present disclosure may include a guide mechanism that guides the magazine loading table so that the magazine loading table is lifted and lowered in a horizontal state. In this way, when the magazine loading table is lifted and lowered, it is possible to prevent the magazine loading table from inclining or rattling.

In the magazine storage device according to the present disclosure, the lifting and lowering mechanism may include a following member that is provided on the magazine loading table and that is capable of adjusting a height, and a wedge member configured to move the magazine loading table up and down by moving in a horizontal direction while being in contact with the following member. In this way, by adjusting the height of the following member, it is possible to adjust the amount of the up and down movement of the magazine loading table as the wedge member moves in the horizontal direction. Accordingly, the delivery height can be adjusted relatively easily.

In the magazine storage device according to the present disclosure, the lifting and lowering mechanism may be a mechanism configured to move the magazine loading table between the delivery height and a work height when work is performed on the component mounter member, the component mounter member may be a component supply member configured to supply a component to be mounted on a board, and the work height may be a height when an exchange device that is capable of replenishing and collecting the component supply member replenishes and collects the component supply member. In this way, the exchange device can replenish and collect the component supply member to and from the magazine storage device.

In the magazine storage device according to the present disclosure, the lifting and lowering mechanism may be a mechanism configured to move the magazine loading table between the delivery height and a work height when a work is performed on the component mounter member, the component mounter member may be a component supply member configured to supply a component to be mounted on a board, and the work height may be a height at which a component pickup section of a component mounter configured to mount the component on the board is capable of picking the component supplied by the component supply member. In this way, the pickup section of the component mounter can pick up the component from the component supply member held on the magazine loading table at the work height.

INDUSTRIAL APPLICABILITY

The magazine storage device of the present disclosure can be used in the manufacturing industry of the component mounting system.

REFERENCE SIGNS LIST

10: component mounting system, 11: printing machine, 12: printing inspection machine, 13: keeping device, 14: component mounting line, 15: reflow device, 16: visual inspection device, 17: management device, 18: component mounter, 20: feeder, 21: tape, 22: tape reel, 23: tape feeding mechanism, 25: connector, 27: rail, 30: magazine, 31: magazine main body, 32: slot, 33: engaged portion, 34: clamped portion, 35: connector, 36: connector, 40: magazine storage device, 45: control device, 45a: CPU, 45b: ROM, 45c: RAM, 45d: storage, 50: magazine loading table, 51: plate, 52: magazine loading table main body, 54: motor, 55: roller attachment member, 56: roller, 57: connector, 58: wall section, 60: lifting and lowering mechanism, 61: following member, 62: guide roller support, 62a: set screw, 62b: screw, 63: guide roller, 64: wedge member, 64a: inclined surface, 65: air cylinder, 66: shaft, 70: guide mechanism, 71: movable member, 72: first link member, 72a: rear side portion, 72b: front side portion, 73: second link member, 73a: rear side portion, 73b: front side portion, 74: needle bearing, 75: connection member, 76: shaft, 77: shaft, 78: needle bearing, 79: fixed member, 80: clamp mechanism, 81: air cylinder, 82: clamp slider, 83: clamp, 84: stopper, 90: anti-back mechanism, 91: main body, 92: spring, 93: shaft, 94: hook, 94a: guide surface, 95: air cylinder, 96: pin, 100: conveyance wheeled platform, 101: magazine transfer machine, 104: automated guided vehicle, 105: control device, 110: loader, P: component, S: board

The invention claimed is:

1. A magazine storage device for delivering a magazine capable of holding a component mounter member between the magazine storage device and a conveyance wheeled platform configured to convey the magazine, the magazine storage device comprising:
   a magazine loading table configured to place the magazine thereon, the magazine loading table including a plate, a magazine loading table main body provided substantially at a center of an upper surface of the plate, and rollers provided on each of left and right sides of the magazine loading table main body along a front-rear direction;
   a lifting and lowering mechanism configured to change a delivery height when the magazine loading table performs delivery of the magazine;
   a clamp mechanism configured to clamp the magazine placed on the magazine loading table; and
   an anti-back mechanism configured to prevent the magazine placed on the magazine loading table from moving along the front-rear direction and coming out of the magazine loading table,
   wherein the clamp mechanism and the anti-back mechanism are disposed between the rollers in a left-right direction.

2. The magazine storage device according to claim 1, further comprising:
   a guide mechanism configured to guide the magazine loading table so that the magazine loading table is lifted and lowered in a horizontal state.

3. The magazine storage device according to claim 1, wherein the lifting and lowering mechanism includes a following member that is provided on the magazine loading table and that is capable of adjusting a height, and a wedge member configured to move the magazine loading table up and down by moving in a horizontal direction while being in contact with the following member.

4. The magazine storage device according to claim 1, wherein the lifting and lowering mechanism is a mechanism configured to move the magazine loading table between the delivery height and a work height when work is performed on the component mounter member, the component mounter member is a component supply member configured to supply a component to be mounted on a board, and the work height is a height when an exchange device that is capable of replenishing and collecting the component supply member replenishes and collects the component supply member.

5. The magazine storage device according to claim 1, wherein the lifting and lowering mechanism is a mechanism configured to move the magazine loading table between the delivery height and a work height when work is performed on the component mounter member, the component mounter member is a component supply member configured to supply a component to be mounted on a board, and the work height is a height at which a component pickup section of a component mounter configured to mount the component on the board is capable of picking the component supplied by the component supply member.

\* \* \* \* \*